(12) United States Patent  (10) Patent No.: US 7,307,698 B2
Miyajima et al.  (45) Date of Patent: Dec. 11, 2007

(54) EXPOSURE APPARATUS AND DEVICE MANUFACTURING METHOD

(75) Inventors: Yoshikazu Miyajima, Utsunomiya (JP); Yasuhiro Fujiwara, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 78 days.

(21) Appl. No.: 11/059,331

(22) Filed: Feb. 17, 2005

(65) Prior Publication Data

US 2005/0185166 A1  Aug. 25, 2005

(30) Foreign Application Priority Data

Feb. 18, 2004  (JP)  ............................. 2004-040977

(51) Int. Cl.
  *G03B 27/62* (2006.01)
  *G03B 27/58* (2006.01)
(52) U.S. Cl. .......................................... 355/75; 355/72
(58) Field of Classification Search ................. 355/72, 355/75, 53; 248/550
  See application file for complete search history.

(56) References Cited

U.S. PATENT DOCUMENTS 6,196,532 B1* 3/2001 Otwell ........................ 269/21
6,266,133 B1 7/2001 Miyajima et al. ............. 355/72
6,320,649 B1 11/2001 Miyajima et al. ............. 355/72
6,583,859 B2 6/2003 Miyajima et al. ............. 355/72
6,801,301 B2 10/2004 Miyajima et al. ............. 355/72
2005/0007575 A1 1/2005 Miyajima ..................... 355/72
2005/0011460 A1* 1/2005 Taniguchi .................... 118/728
2005/0140962 A1* 6/2005 Ottens et al. .................. 355/75

FOREIGN PATENT DOCUMENTS

JP  7-326566  12/1995
JP  8-167553  6/1996
JP  8-288371  11/1996

* cited by examiner

*Primary Examiner*—Peter B. Kim
(74) *Attorney, Agent, or Firm*—Fitzpatrick, Cella, Harper & Scinto

(57) ABSTRACT

An exposure apparatus including a projecting optical system for projecting a pattern of the original onto a substrate, and an original stage being movable while carrying the original thereon. The original stage includes (i) a first holding portion for holding the original and having a first surface to be contacted to one surface of the original, the first holding portion being configured to position the original in a direction perpendicular to the surface, and (ii) a second holding portion for holding the original and having a second surface to be contacted to the surface, the second holding portion being elastically or resiliently deformable.

12 Claims, 15 Drawing Sheets

EXPOSURE APPARATUS AND DEVICE MANUFACTURING METHOD

FIELD OF THE INVENTION AND RELATED ART

This invention relates to an exposure apparatus for transferring a pattern of an original, such as a reticle, for example, onto a substrate, such as a silicon wafer, for example. In another aspect, the invention concerns a device manufacturing method using such an exposure apparatus.

Referring to FIGS. 12, 13A, 13B, 14A and 14B, an example of a conventional exposure apparatus will be described briefly. Denoted in these drawings at 101 is a reticle (original) having an exposure pattern. Denoted at 102 is a reticle stage for carrying the reticle thereon and moving the reticle relative to exposure light, for scan exposure of the same. Denoted at 103 is a reticle clamp as clamping means for clamping the reticle 101 to the reticle stage 102. Denoted at 104 is a reduction projection lens for projecting a pattern formed on the reticle 101 onto a wafer 105, which comprises a silicon substrate, in a reduced scale.

Denoted at 106 is a wafer stage for carrying the wafer thereon and is scanningly movable relative to the exposure light in synchronism with the reticle stage 102, for scan exposure of the wafer.

Conventionally, as in the exposure apparatus of this example, for clamping the reticle 101 with the reticle clamp 103, the reticle clamp 103 is provided with reticle clamp pads 103A, as shown in FIGS. 14A and 14B. These clamp pads are vacuum pads, and the reticle 101 is vacuum attracted thereby.

The conventional structure involves inconveniences such as follows. As shown in FIG. 14B, when the reticle is clamped at the top face of the reticle clamp pad 103A, and if there is a particle 103B adhered to the clamping surface, it causes degradation of defocus in the pattern surface during the projection of the reticle pattern onto the wafer, as well as degradation of precision of the pattern formed on the wafer. Furthermore, due to any differences in flatness between the surface of the reticle 101 and the surfaces constituting the four reticle clamp pads 103A, there is a possibility that the reticle 101 surface is distorted when it is clamped.

SUMMARY OF THE INVENTION

It is accordingly an object of the present invention to provide an exposure apparatus by which distortion of an original being attributable to adhesion of particles on an original holding portion and/or to a difference in flatness between the original and the original supporting portion can be reduced or avoided.

In accordance with an aspect of the present invention, there is provided an exposure apparatus, comprising an original stage being movable while carrying an original thereon, and a projection optical system for projecting a pattern of the original onto a substrate, wherein the original stage includes a first holding portion for holding the original and having a first surface for positioning the original, and a second holding portion for holding the original and having a second surface to be contacted to the original, the second surface being elastically or resiliently deformable.

Briefly, in accordance with the present invention, an exposure apparatus, with which distortion of an original being attributable to adhesion of particles on an original holding portion and/or to a difference in flatness between the original and the original supporting portion can be reduced or avoided, can be accomplished.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 4A and 4B illustrate a main portion of FIG. 1, wherein FIG. 4A is a plan view and FIG. 4B is a side view.

FIGS. 5A and 5B illustrate a main portion of FIG. 1, wherein FIG. 5A is a plan view and FIG. 5B is a fragmentarily enlarged sectional view of it.

FIGS. 6A, 6B and 6C illustrate a main portion of FIG. 1, wherein FIG. 6A is a plan view, FIG. 6B is a sectional view taken on a line A-A of FIG. 6A, and FIG. 6C is a sectional view taken on a line B-B of FIG. 6A.

FIGS. 7A and 7B illustrate an elastic chuck according to the first embodiment of the present invention, wherein FIG. 7A is a sectional view and FIG. 7B is an enlarged sectional view of a portion inside an ellipsoid depicted by a broken line (dash-and-dots line) in FIG. 7A.

FIGS. 8A and 8B illustrate an exposure apparatus according to a second embodiment of the present invention, wherein FIG. 8A is a plan view and FIG. 8B is a sectional view taken on a line A-A of FIG. 8A.

FIGS. 9A and 9B illustrate an elastic chuck of the exposure apparatus according to the second embodiment of the present invention, wherein FIG. 9A is a sectional view and FIG. 9B is an enlarged sectional view of a portion inside an ellipsoid depicted by a broken line (dash-and-dots line) in FIG. 9A.

FIGS. 10A and 10B illustrate an elastic chuck of an exposure apparatus according to a third embodiment of the present invention, wherein FIG. 10A is a sectional view and FIG. 10B is an enlarged sectional view taken on a line A-A in FIG. 10A.

FIGS. 11A and 11B illustrate an elastic chuck of an exposure apparatus according to a fourth embodiment of the present invention, wherein FIG. 11A is a sectional view and FIG. 11B is an enlarged sectional view of a portion inside an ellipsoid depicted by a broken line (dash-and-dots line) in FIG. 11A.

FIGS. 13A and 13B schematically illustrate a conventional exposure apparatus, wherein FIG. 13A is a plan view and FIG. 13B is a side view.

FIGS. 14A and 14B schematically illustrate a reticle stage of the exposure apparatus of FIG. 12, wherein FIG. 14A is a plan view and FIG. 14B is an enlarged sectional view taken on a line A-A of FIG. 14A.

DESCRIPTION OF THE PREFERRED EMBODIMENTS

Preferred embodiments of the present invention will now be described with reference to the attached drawings. Specifically, examples wherein an original is a reticle and a substrate is a wafer will be described below.

Embodiment 1

Figure 1:
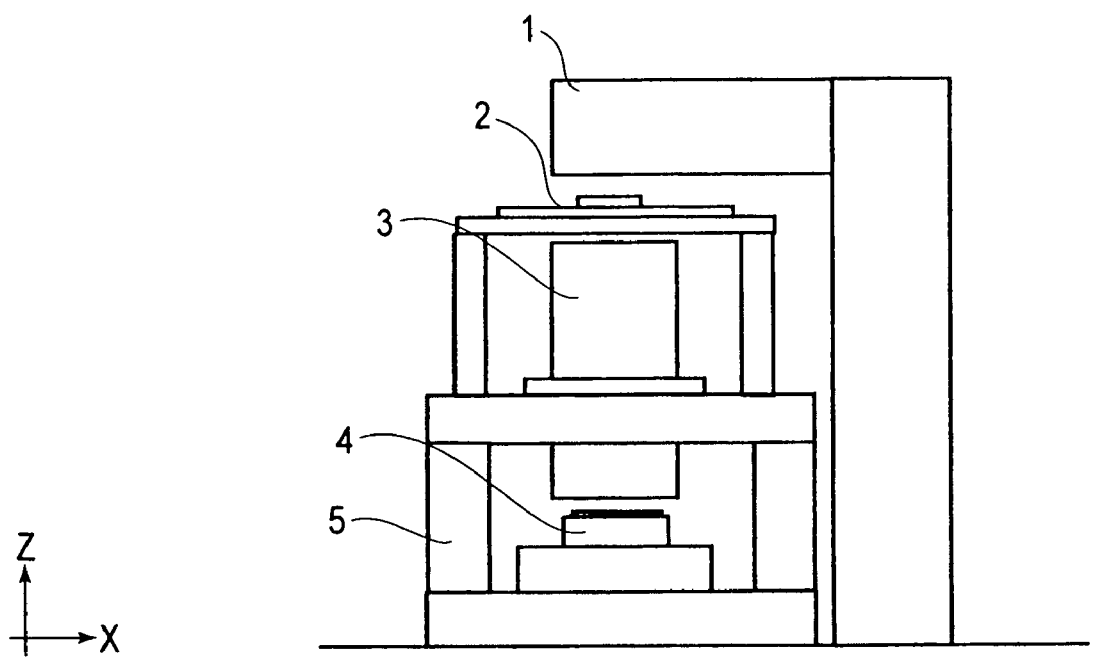
FIG. 1 is a side view schematically illustrating an exposure apparatus according to a first embodiment of the present invention.
Figure 2:
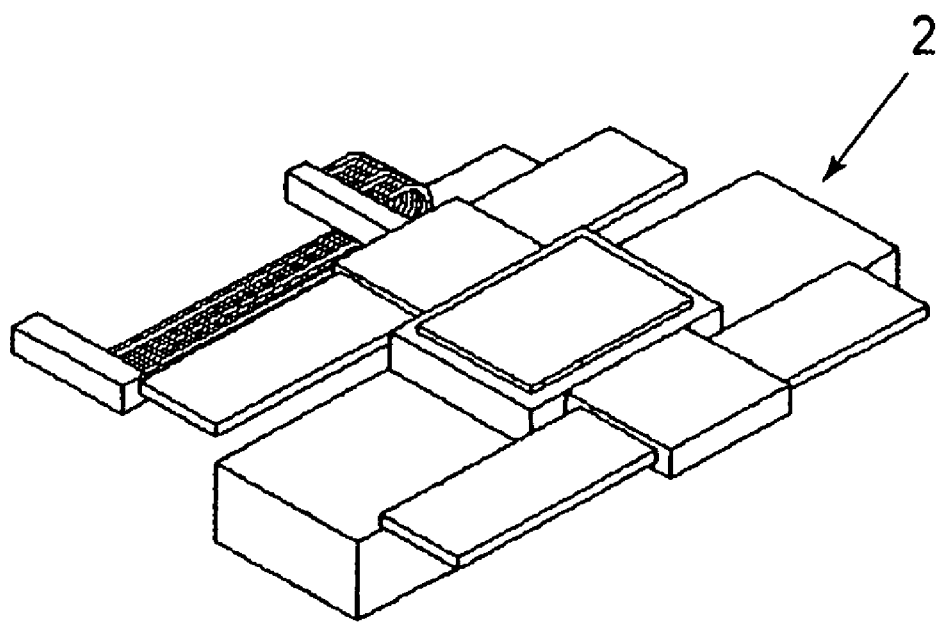
FIG. 2 is a perspective view for schematically illustrating a reticle stage in the first embodiment of the present invention.
Figure 2:
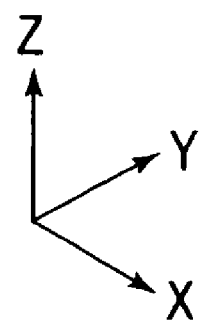

FIG. 1 is a side view schematically illustrating an exposure apparatus according to a first embodiment of the present invention. FIG. 2 is a perspective view for schematically illustrating a reticle stage in the first embodiment of the present invention.

Figure 3:
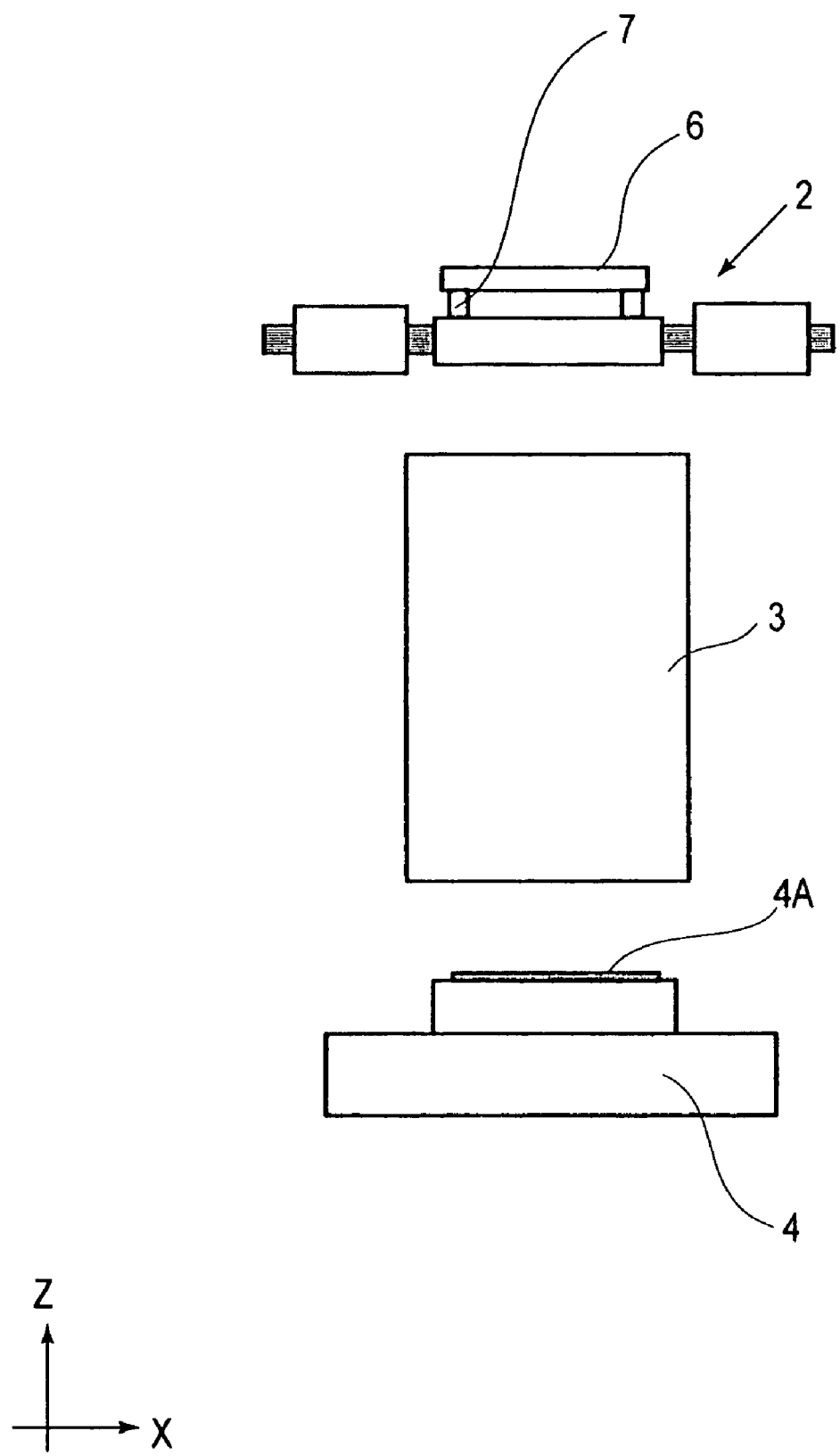
FIG. 3 is a side view schematically illustrating a main portion of the exposure apparatus of the FIG. 1 embodiment.
Figure 4A:
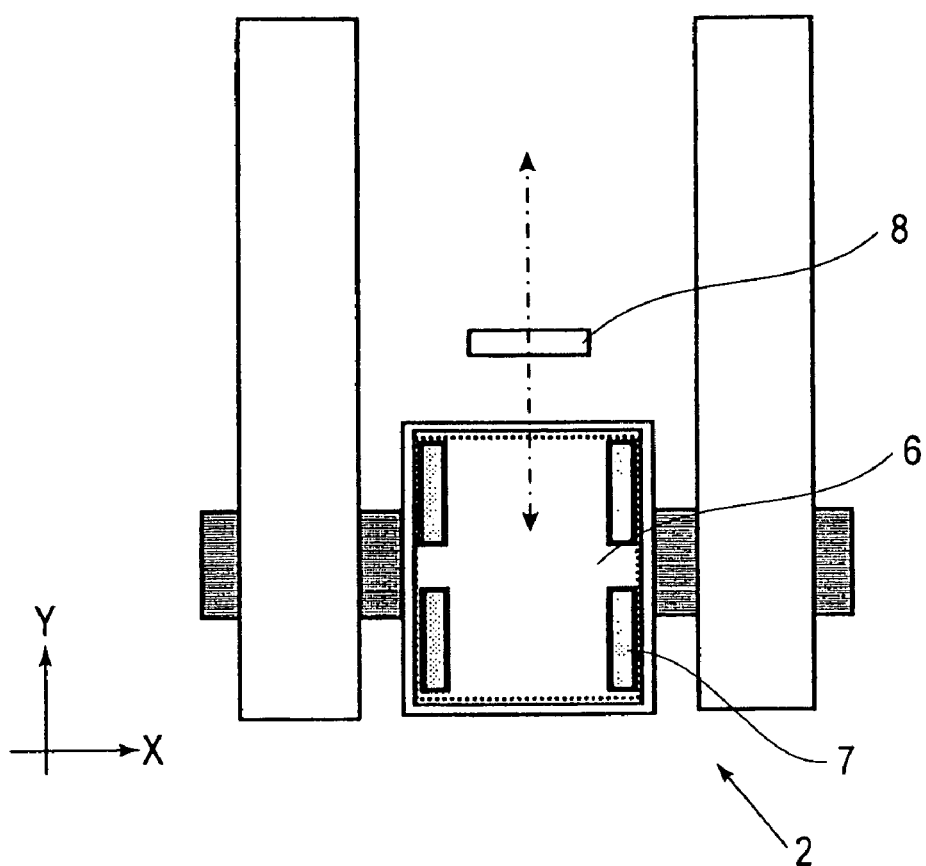
Figure 4B:
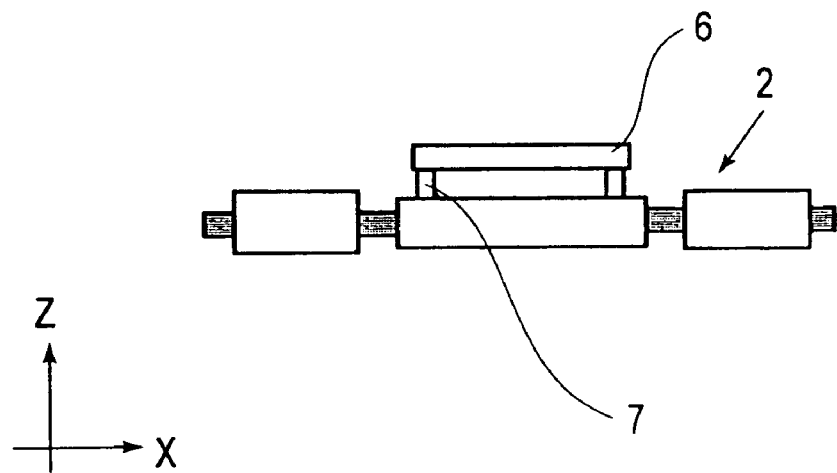

FIG. 3 is a side view schematically illustrating a main portion of the exposure apparatus of the FIG. 1 embodiment. FIGS. 4A and 4B illustrate a main portion of FIG. 1, wherein FIG. 4A is a plan view and FIG. 4B is a side view.

Denoted in these drawings at 1 is an illumination unit in which exposure light is produced from a light source and, after being shaped, uniform exposure light is provided. Denoted at 2 is a reticle stage, which carries an exposure original (reticle) thereon and which is arranged to scanningly move the original (reticle) relative to the exposure light for scan exposure of the same. Denoted at 3 is a reduction projection lens for projecting a pattern formed on the original (reticle) onto a wafer, which comprises a silicon substrate, in a reduced scale. Denoted at 4 is a wafer stage, which is arranged to scanningly move relative to the exposure light in synchronism with the reticle stage 2 while carrying the wafer thereon, for scan exposure of the same.

Denoted at 45 is a major assembly of the exposure apparatus. It supports the reticle stage 2, the reduction projection lens 3, the wafer stage 4, and so on. Denoted at 6 is a reticle (original) that has a transfer pattern formed thereon. Denoted at 7 are reticle clamps, which are provided on the reticle stage 2, for attracting and holding the reticle 6 and positioning the same as well. Denoted at 8 is a slit member having a function for passing slit-like exposure light toward the original pattern of the reticle 6.

Figure 5A:
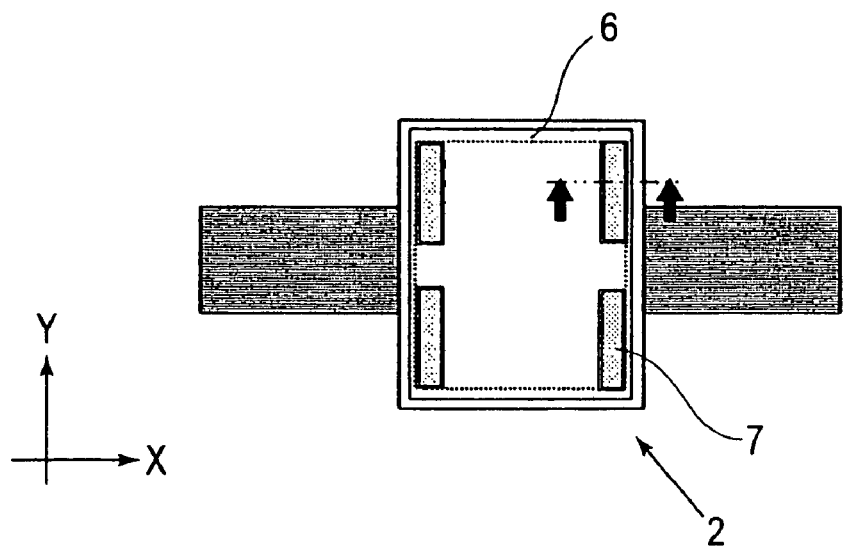
Figure 5B:
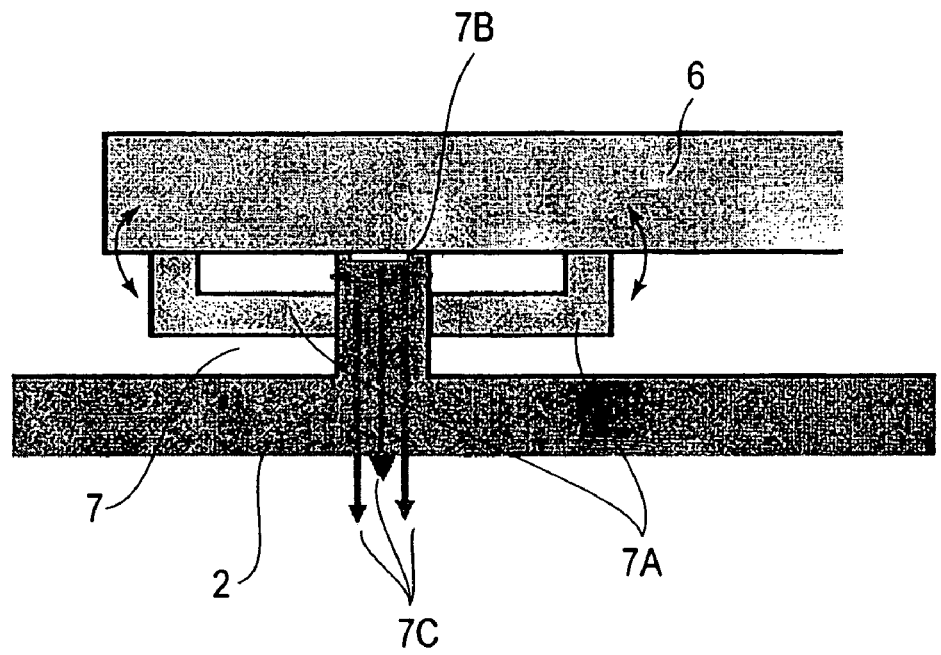

As shown in FIGS. 5A and 5B, the exposure apparatus of this embodiment has a structure for positioning and holding the reticle 6 at the reticle clamp 7 on the reticle stage 2. FIG. 5A shows the state in which the reticle 6 is clamped and positioned on the upper surface of the reticle clamp 7. FIG. 5B is a sectional view for explaining the clamping state in detail.

Here, each reticle clamp 7 has a Z-direction positioning pin chuck 7B having a function for positioning the reticle 6 with respect to a Z direction. There is a vacuum suction means 7C provided at a surface to be connected to the reticle 6, for applying a vacuum suction thereto by which the reticle can be attracted and held fixedly.

Disposed around the Z-direction positioning pin chuck 7B is a thin plate-like elastic chuck member 7A, which is supported elastically or resiliently deformable with respect to the Z-direction positioning chuck 7B.

Figure 6A:
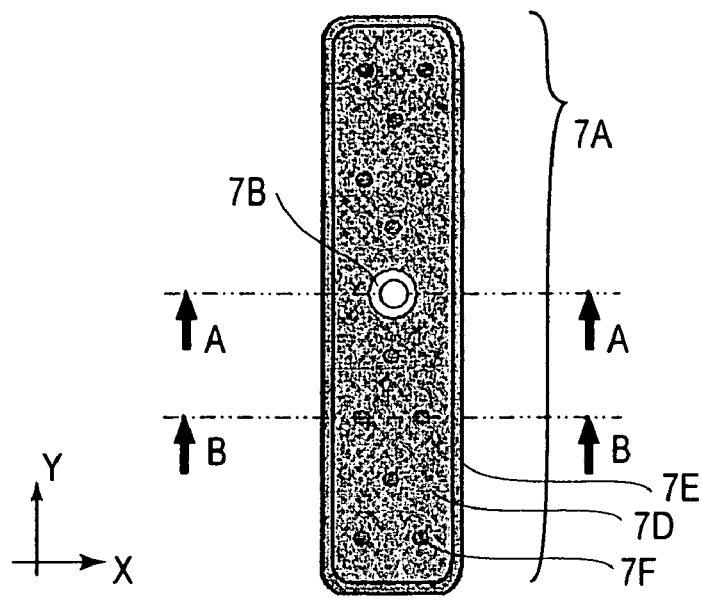
Figure 6B:
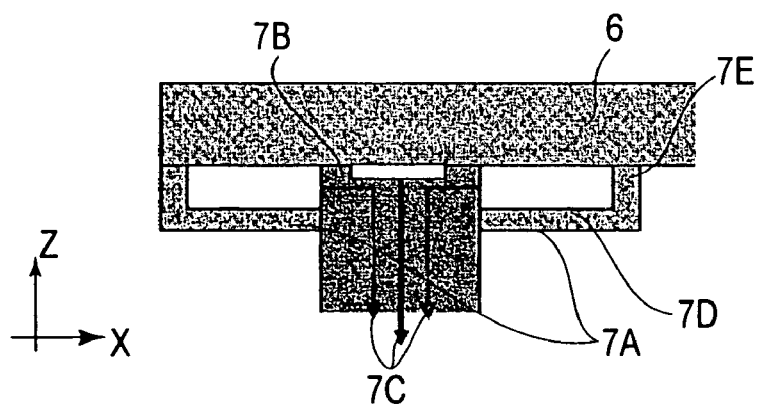
Figure 6C:
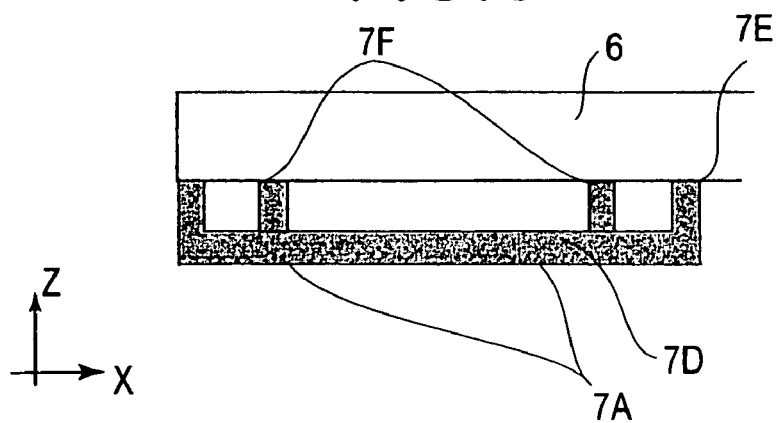

FIGS. 6A, 6B and 6C illustrate how the thin plate-like elastic chuck 7A is mounted. The elastic chuck 7A is formed with an attraction slot 7D, such that a vacuum chamber can be defined there by the vacuum suction means 7C. Additionally, there is a circumferential rim 7E at the outer peripheral edge of the elastic chuck 7A, which provides a surface to be engaged with the reticle 6. There are a plurality of pins 7F provided in a portion of the attraction slot 7D, as best seen in FIGS. 6A and 6C. These pins are arranged so that their tip ends can contact the reticle 6.

Figure 7A:
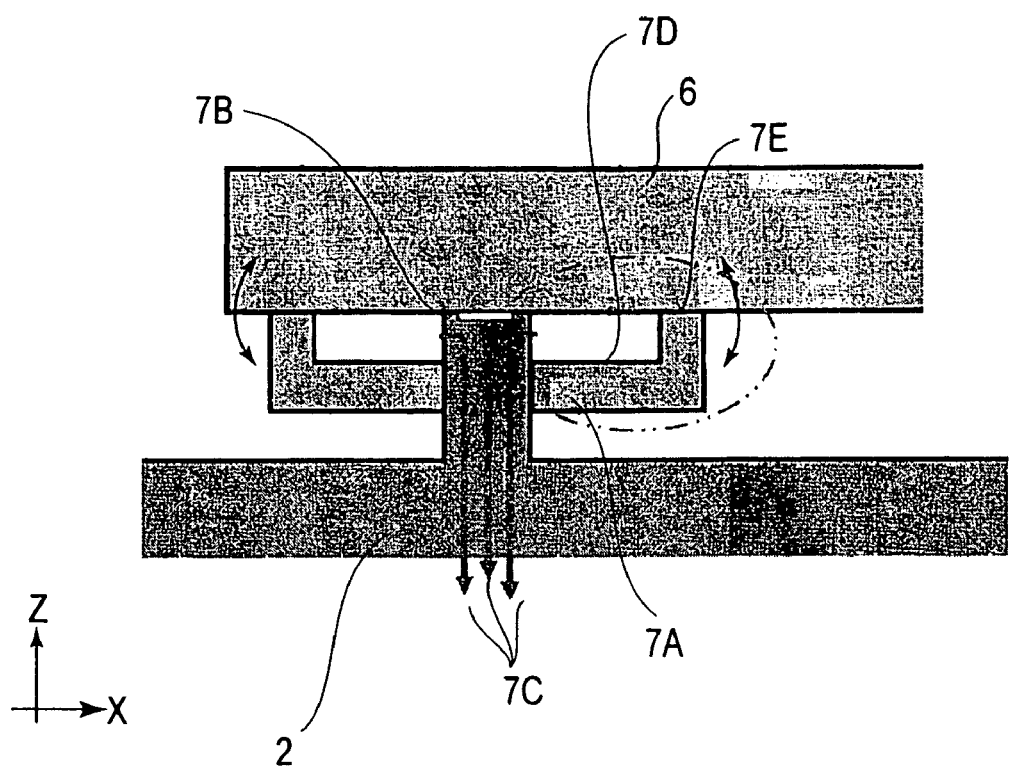
Figure 7B:
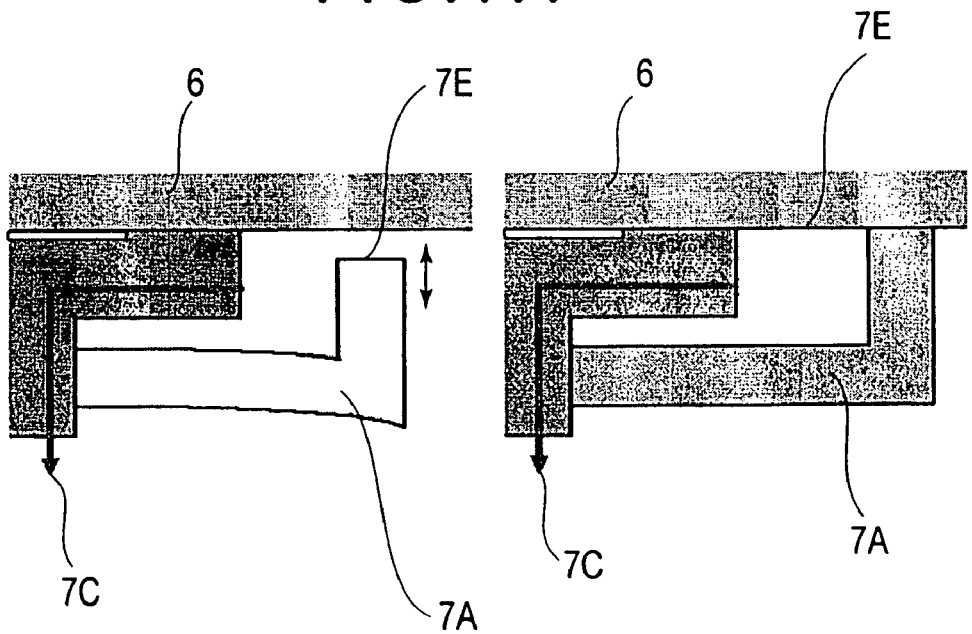

Referring to FIGS. 7A and 7B, the function of the reticle clamp 7 for clamping the reticle 6 will now be explained. FIG. 7A is a sectional view. FIG. 7B is an enlarged section of a portion inside an ellipsoid depicted by a dash-and-dots line (broken line) in FIG. 7A, and it illustrates the displacement state of the elastic chuck 7A as the reticle 6 is clamped thereby. Here, the reticle 6 is first positioned with respect to the Z direction and the X-Y plane relative to the Z-direction positioning pin chuck 7B and, thereafter, it is loaded thereon. In the initial state wherein the elastic chuck 7A does not attract the reticle 6 (left-hand side view of FIG. 7B), the elastic chuck 7A is placed at its extracted position with its outer circumferential rim 7E kept out of contact with the reticle 6.

As the vacuum section means 7C applies a suction force to the elastic chuck 7A to attract the same, as shown in the attracted state (right-hand side view of FIG. 7B), outer circumferential rim 7E of the elastic chuck 7A causes elastic (or resilient) displacement and it is brought into contact with the reticle 6. Hence, with the cooperation of the vacuum attraction surface of the attraction slot 7D, a vacuum attracting and holding force to the reticle 6 is produced there.

Here, the thin plate-like elastic chuck 7A can engage with the reticle 6, while following the sides of the reticle. This provides an advantageous effect of reducing distortion of the reticle 6 to be produced when the same is clamped. Additionally, there are pins 7F at different locations inside the attraction slot 7D. This is effective to reduce the probability of particle adhesion to the surface to be contacted to the reticle 6 and, hence, to reduce the production of distortion due to the particle adhesion.

Embodiment 2

Figure 8A:
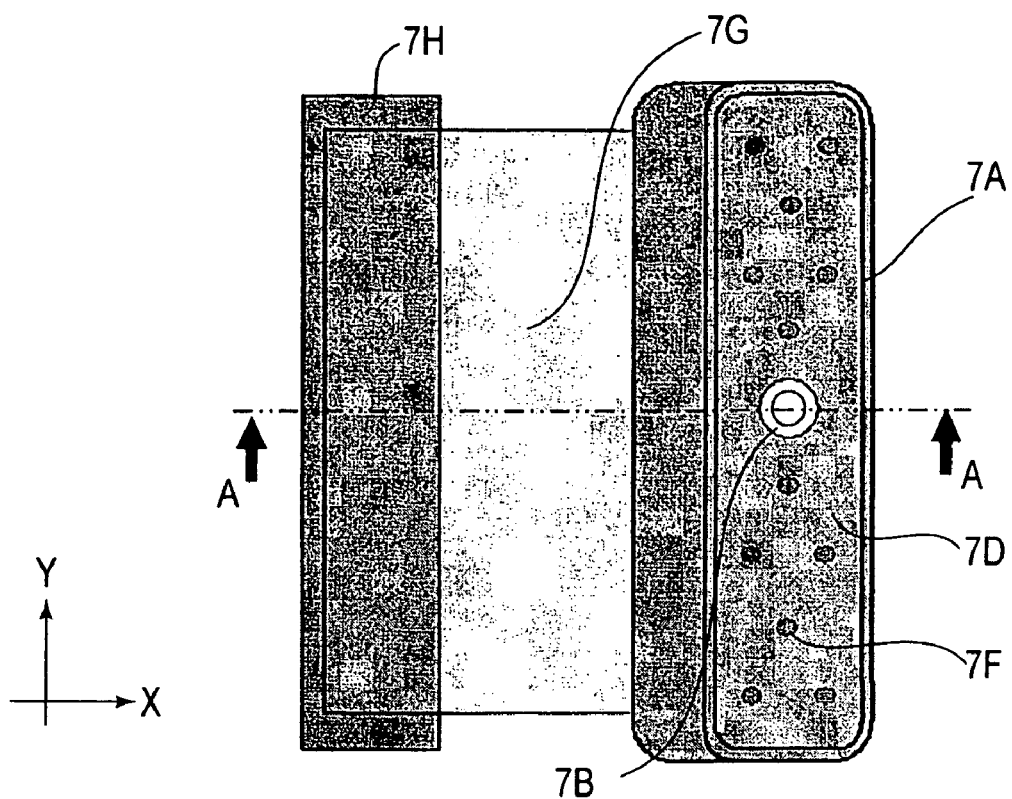
Figure 8B:
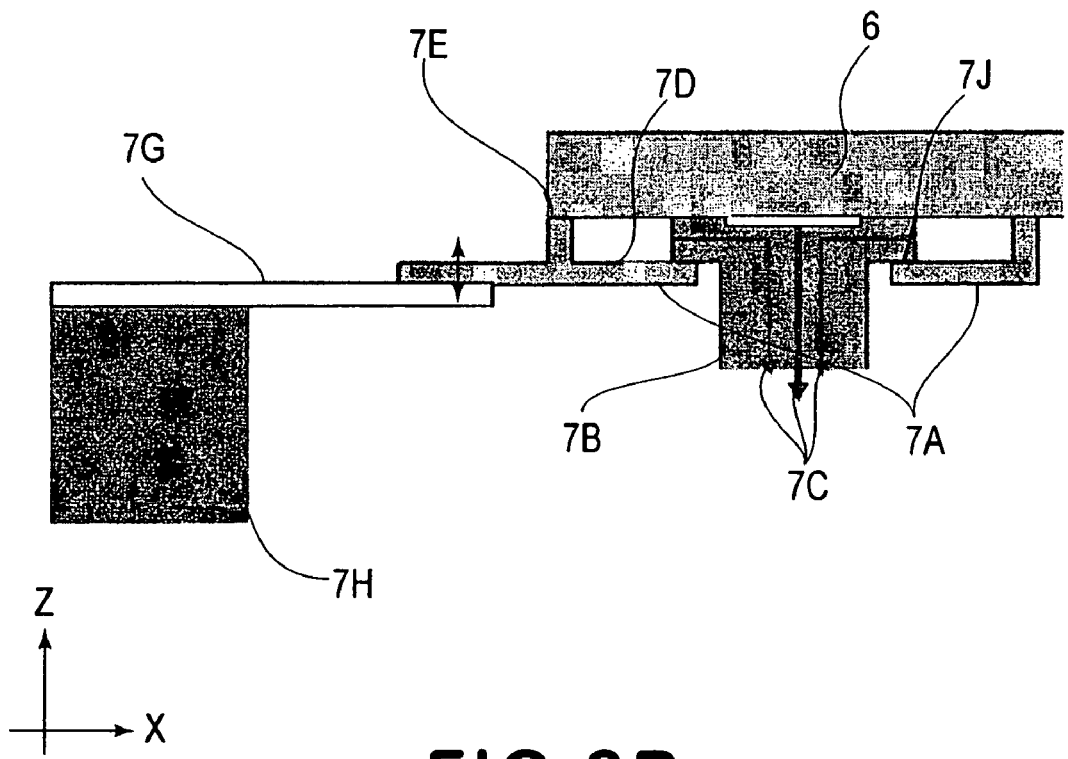

FIGS. 8A and 8B show a second embodiment of the present invention. In the first embodiment, the thin plate-like elastic chuck 7A is fixed to or is made integral with the Z-direction positioning pin chuck 7B, and it is supported thereby for elastic (or resilient) displacement. In the second embodiment, as compared therewith, the thin plate-like elastic chuck 7A is arranged so that it can be supported completely separately from the Z-direction positioning pin chuck 7B.

More specifically, the elastic chuck 7A is separately and elastically or resiliently supported by means of a leaf spring 7G, such that the elastic chuck 7A is freely movable in the Z direction relative to the Z-direction positioning pin chuck 7B. The leaf spring 7G itself is fixed to a leaf spring base 7H, which is provided on the reticle stage 2.

Figure 9A:
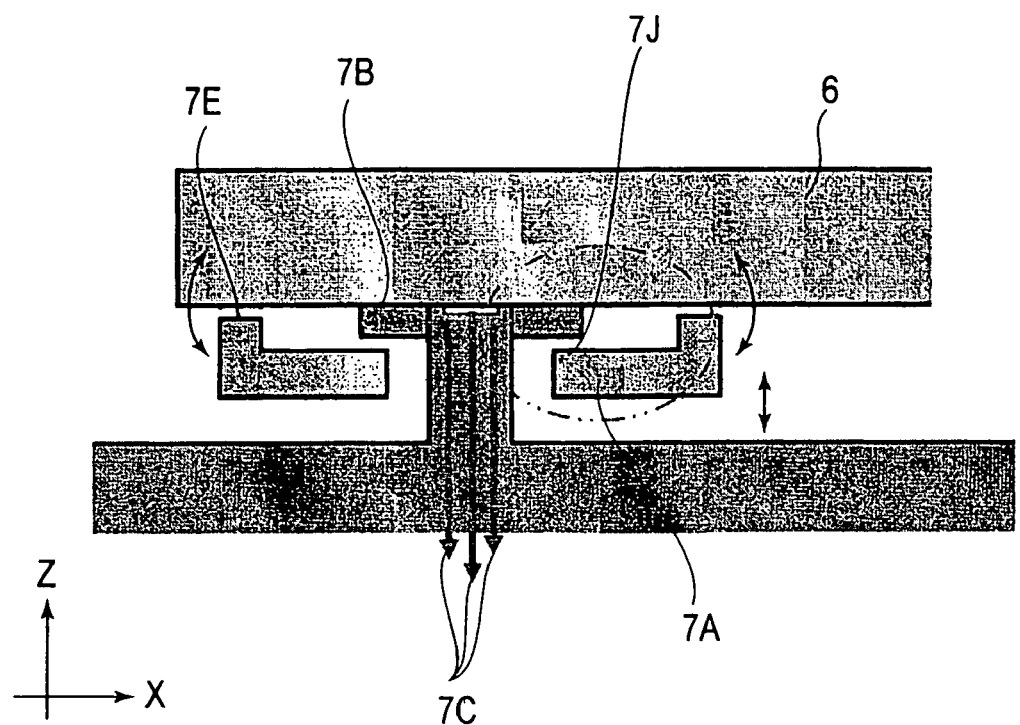
Figure 9B:
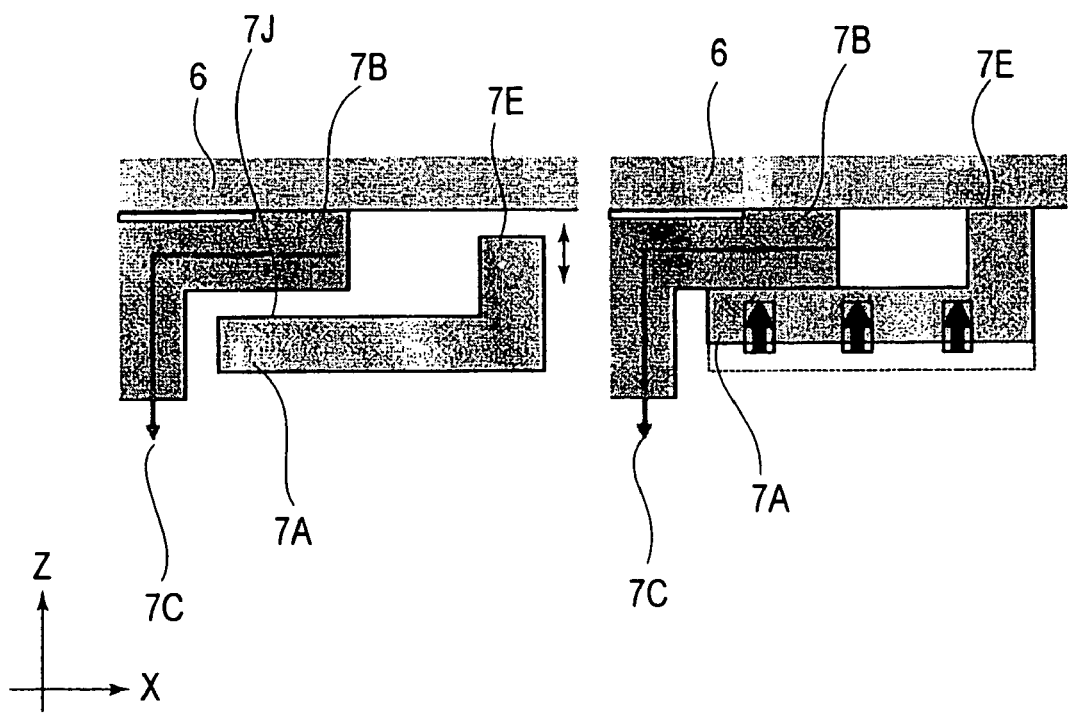

FIGS. 9A and 9B illustrate elastic motion of the elastic chuck 7A in the structure described above. As shown in FIG. 9A, the elastic chuck 7A is elastically or resiliently supported by the leaf spring 7G, for freedom only in the Z direction.

First, the reticle 6 is loaded on the Z-direction positioning pin chuck 7B after being positioned with respect to the Z direction and the X-Y plane.

In the initial state wherein the elastic chuck 7A does not attract the reticle 6 (left-hand side view of FIG. 9B), the elastic chuck 7A is placed at its extracted position with its outer circumferential rim 7E kept out of contact with the reticle 6.

As the vacuum suction means 7C applies a suction force to the elastic chuck 7A to attract the same, as shown in the attracted state (right-hand side view of FIG. 9B), the outer circumferential rim 7E of the elastic chuck 7A causes elastic displacement and it is brought into contact with the reticle 6. Additionally, an engagement sealing surface 7J abuts against the Z-direction positioning pin chuck 7B. Hence, with the cooperation of the vacuum attraction surface of the attraction slot 7D (FIGS. 8A and 8B), a vacuum attracting and holding force to the reticle 6 is produced there.

Here, the thin plate-like elastic chuck 7A can engage with the reticle 6 while following the sides of the reticle. This provides an advantageous effect of reducing distortion of the reticle 6 to be produced when the same is clamped. Additionally, as shown in FIG. 8A, a plurality of pins 7F, similar to those shown in FIG. 6C, may be provided at different locations inside the attraction slot 7D, so that they protrude upwardly to be contacted to the bottom face of the reticle 6. This is effective to reduce the probability of particle adhesion to the surface to be contacted to the reticle 6 and, hence, to reduce the production of distortion due to the particle adhesion.

Embodiment 3

Figure 10A:
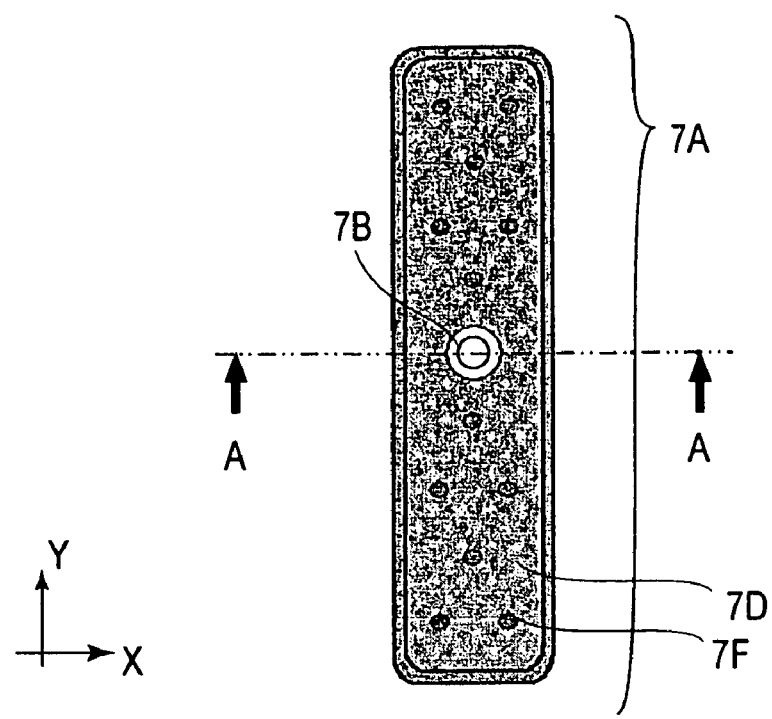
Figure 10B:
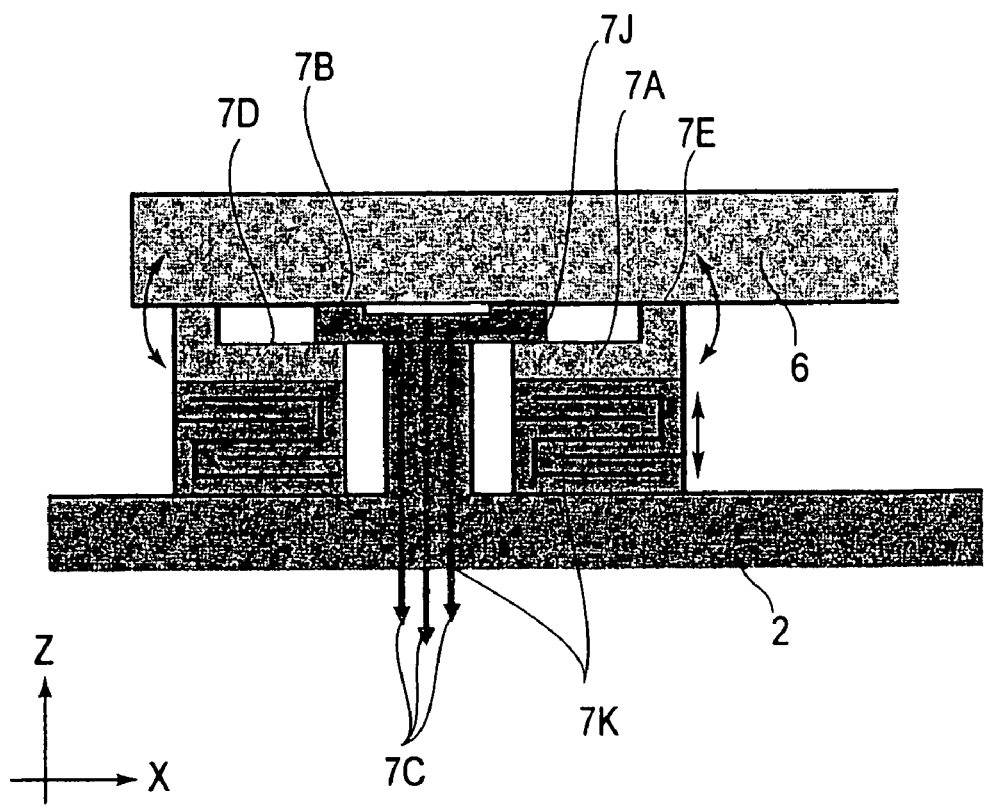

FIGS. 10A and 10B illustrate an exposure apparatus according to a third embodiment of the present invention. In the second embodiment, the elastic support is provided by use of a thin plate-like spring member. In the third embodiment, an elastic or a resilient hinge 7K having a folded structure being elastically or resiliently displacable in the Z direction can be used.

The thin plate-like elastic chuck 7A is supported separately and elastically by means of an elastic hinge 7K, by which the elastic chuck is made freely movable for Z-direction motion, relative to the Z-direction positioning pin chuck 7B. The elastic hinge 7K itself is fixed onto the reticle stage 2.

Referring to FIGS. 9A and 9B, the elastic motion of the elastic chuck 7A in the structure described above, will be explained. As shown in FIG. 9A, the elastic chuck 7A is elastically supported by the elastic hinge 7K, for freedom only in the Z direction.

First, the reticle 6 is loaded on the Z-direction positioning pin chuck 7B after being positioned with respect to the Z direction and the X-Y plane.

In the initial state wherein the elastic chuck 7A does not attract the reticle 7 (FIG. 9B), the elastic chuck 7A is placed at its extracted position with its outer circumferential rim 7E kept out of contact with the reticle 6.

As the vacuum suction means 7C applies a suction force to the elastic chuck 7A to attract the same, as shown in the attracted state (FIG. 9B), the outer circumferential rim 7E of the elastic chuck 7A causes elastic displacement and it is brought into contact with the reticle 6. Additionally, an engagement sealing surface 7J abuts against the Z-direction positioning pin chuck 7B. Hence, with the cooperation of the vacuum attraction surface of the attraction slot 7D, a vacuum attracting and holding force to the reticle 6 is produced there.

Here, the thin plate-like elastic chuck 7A can engage with the reticle 6 while following the sides of the reticle. This provides an advantageous effect of reducing distortion of the reticle 6 to be produced when the same is clamped. Additionally, as shown in FIG. 10A, a plurality of pins 7F, similar to those shown in FIG. 6C, may be provided at different locations inside the attraction slot 7D, so that they protrude upwardly to be contacted to the bottom face of the reticle 6. This is effective to reduce the probability of particle adhesion to the surface to be contacted to the reticle 6 and, hence, to reduce the production of distortion due to the particle adhesion.

Embodiment 4

Figure 11A:
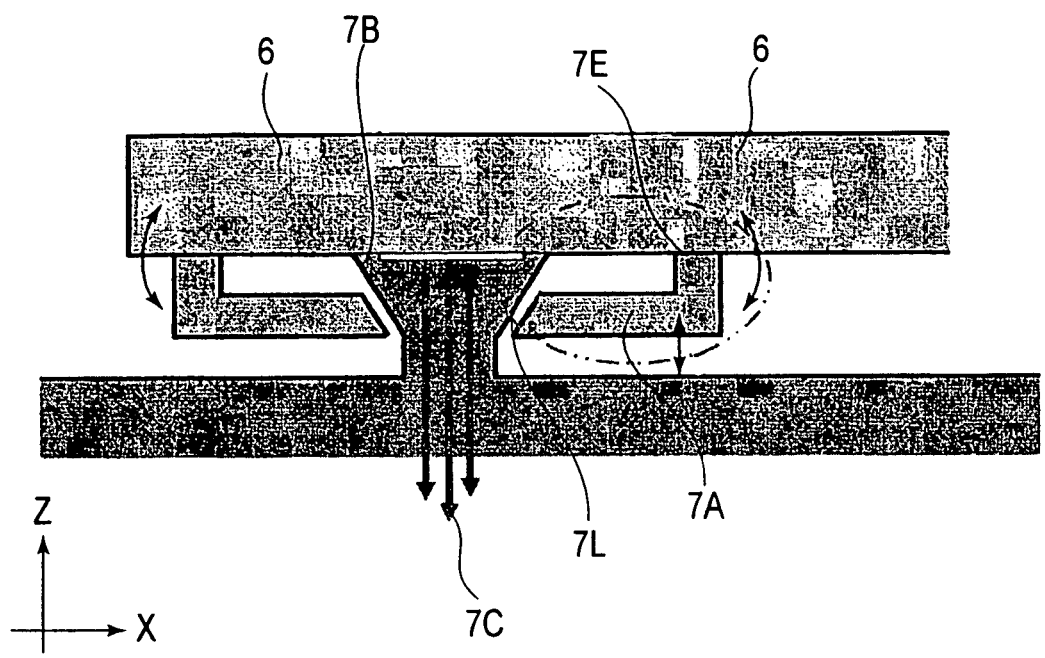
Figure 11B:
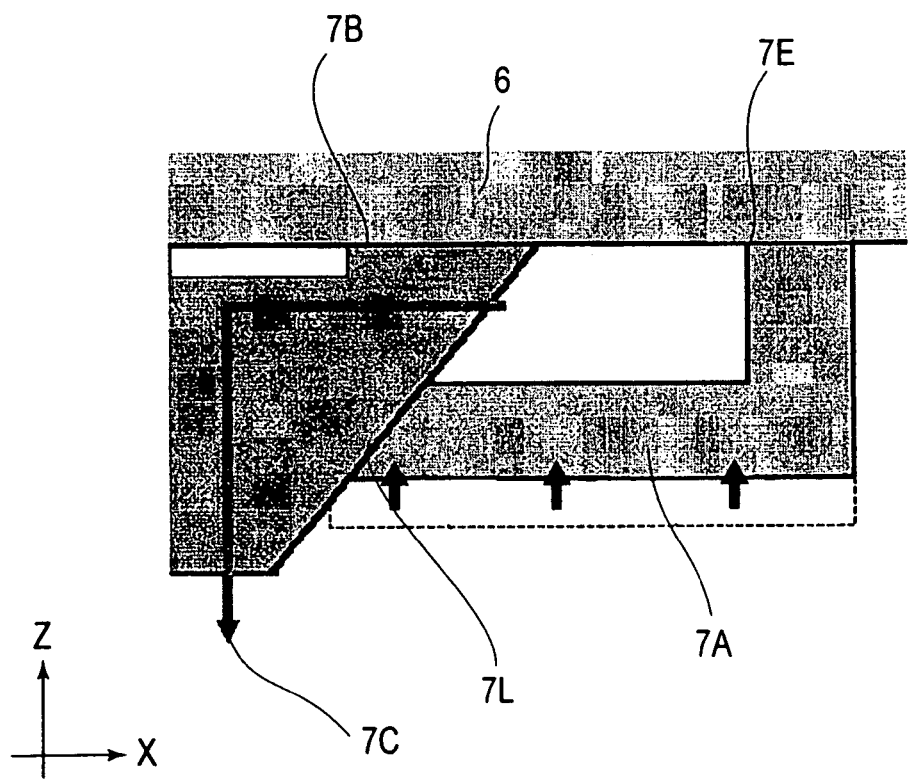
Figure 12:
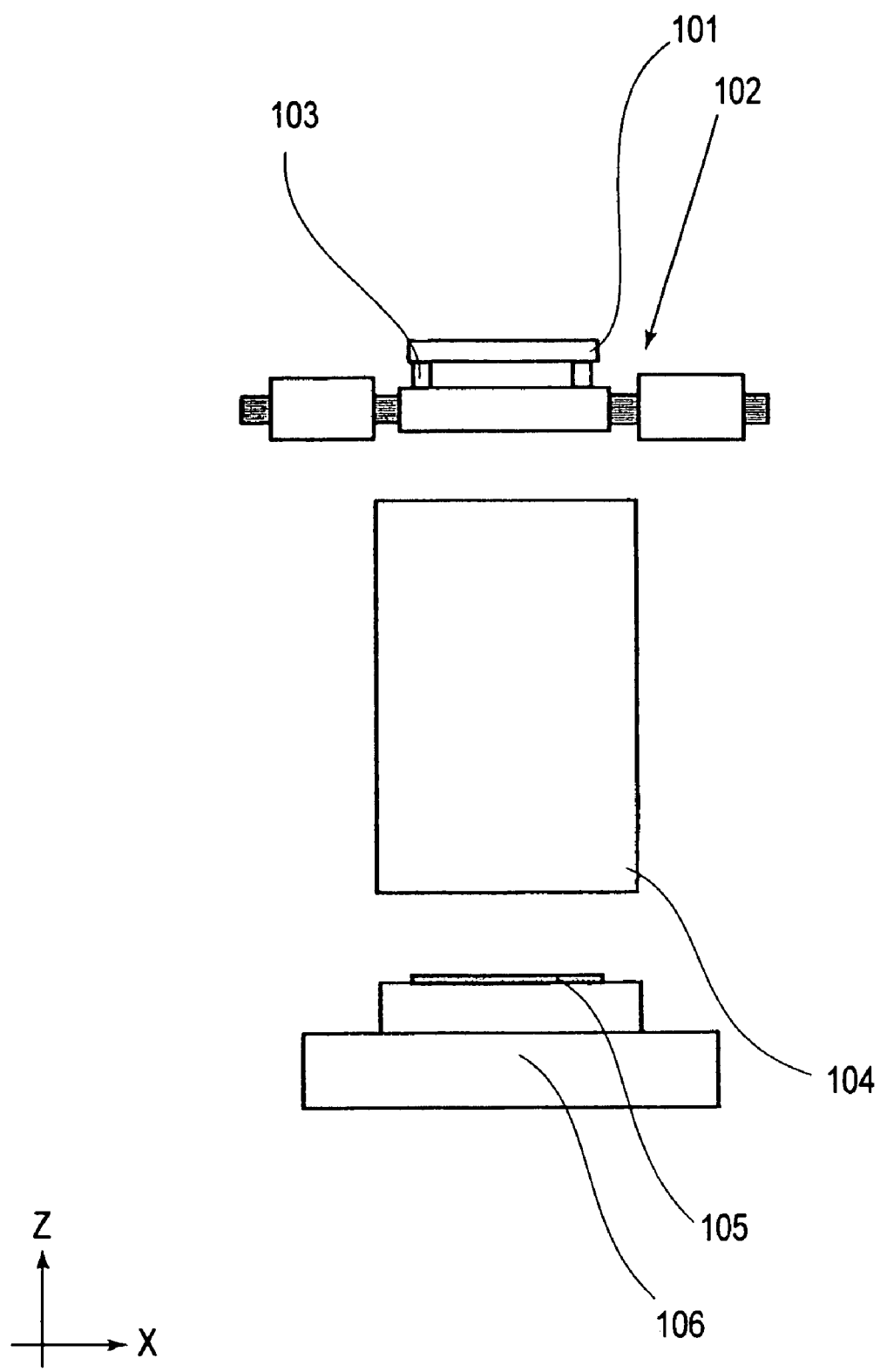
FIG. 12 is a schematic view of a conventional exposure apparatus.
Figure 13A:
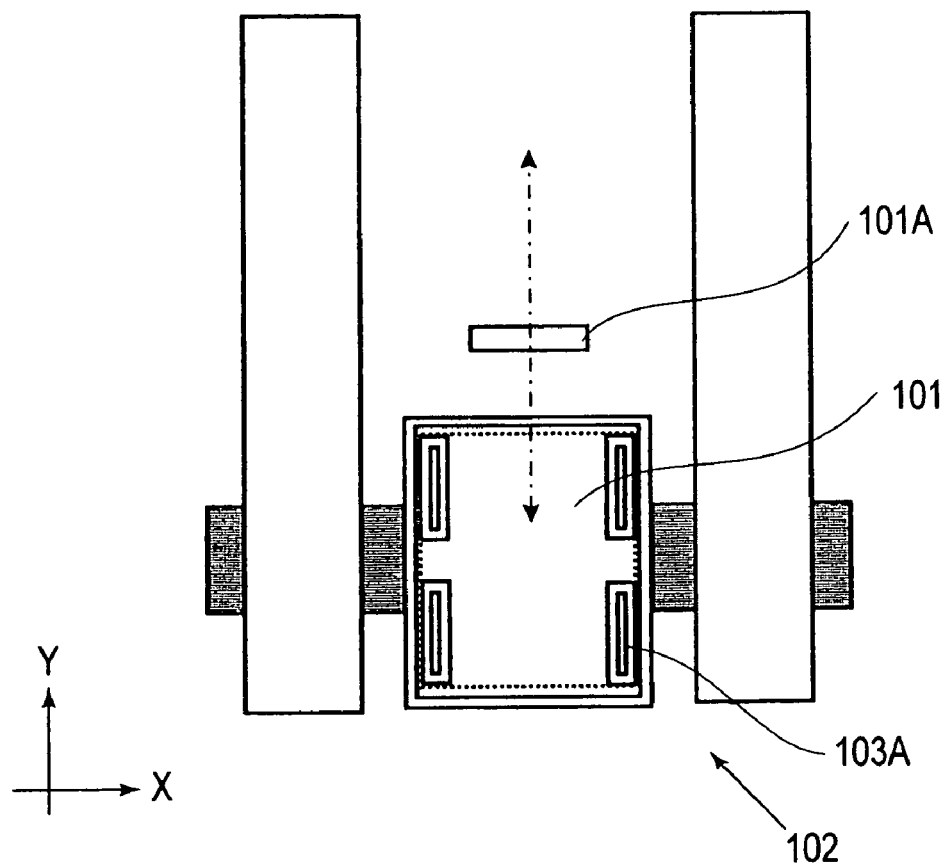
Figure 13B:
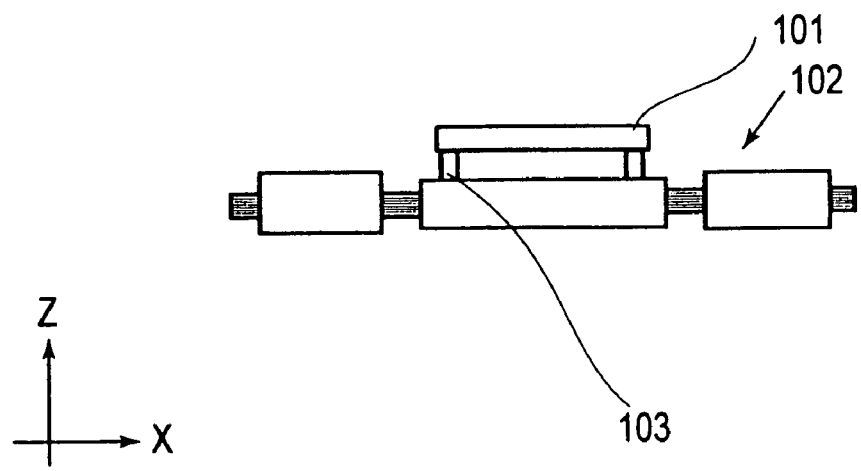
Figure 14A:
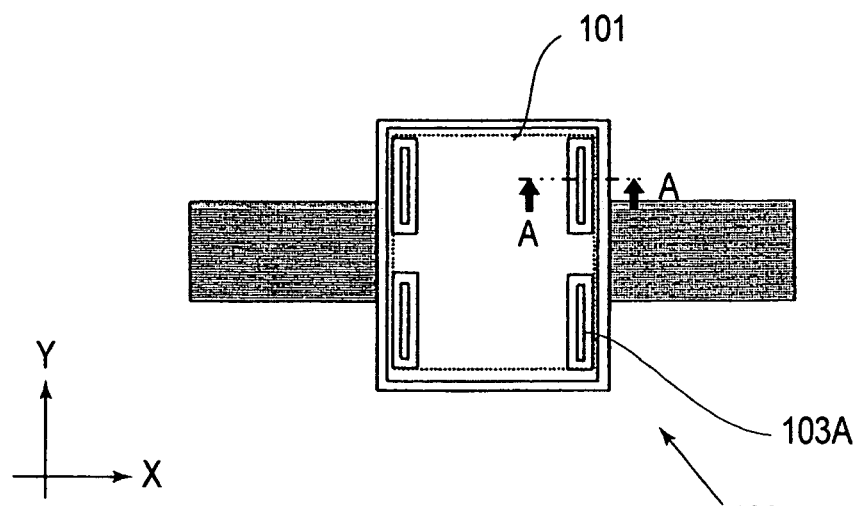
Figure 14B:
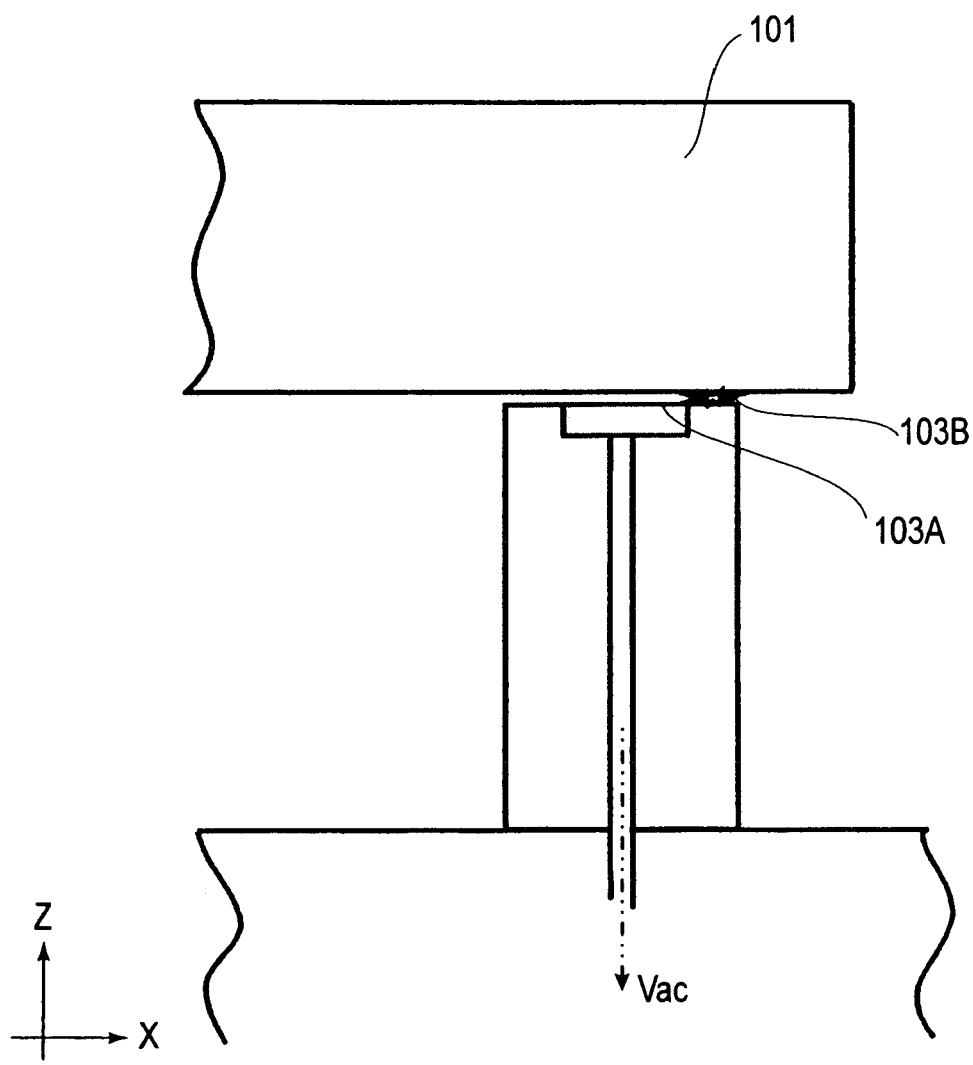

FIGS. 11A and 11B illustrate a fourth embodiment of the present invention. In this embodiment, the sealing abutment between the Z-direction positioning pin 7B and the thin plate-like elastic chuck 7A is provided by an engagement sealing interface 7L having a tapered structure. With this arrangement of the reticle clamp 7, the engagement sealing interface 7L can provide a self-centering effect when a vacuum suction is applied. Thus, a stable sealing effect is assured.

Embodiment 5

Next, as a fifth embodiment of the present invention, an embodiment of a device manufacturing method, which uses an exposure apparatus according to any one of the first to fourth embodiments described above, will be explained.

Figure 15:
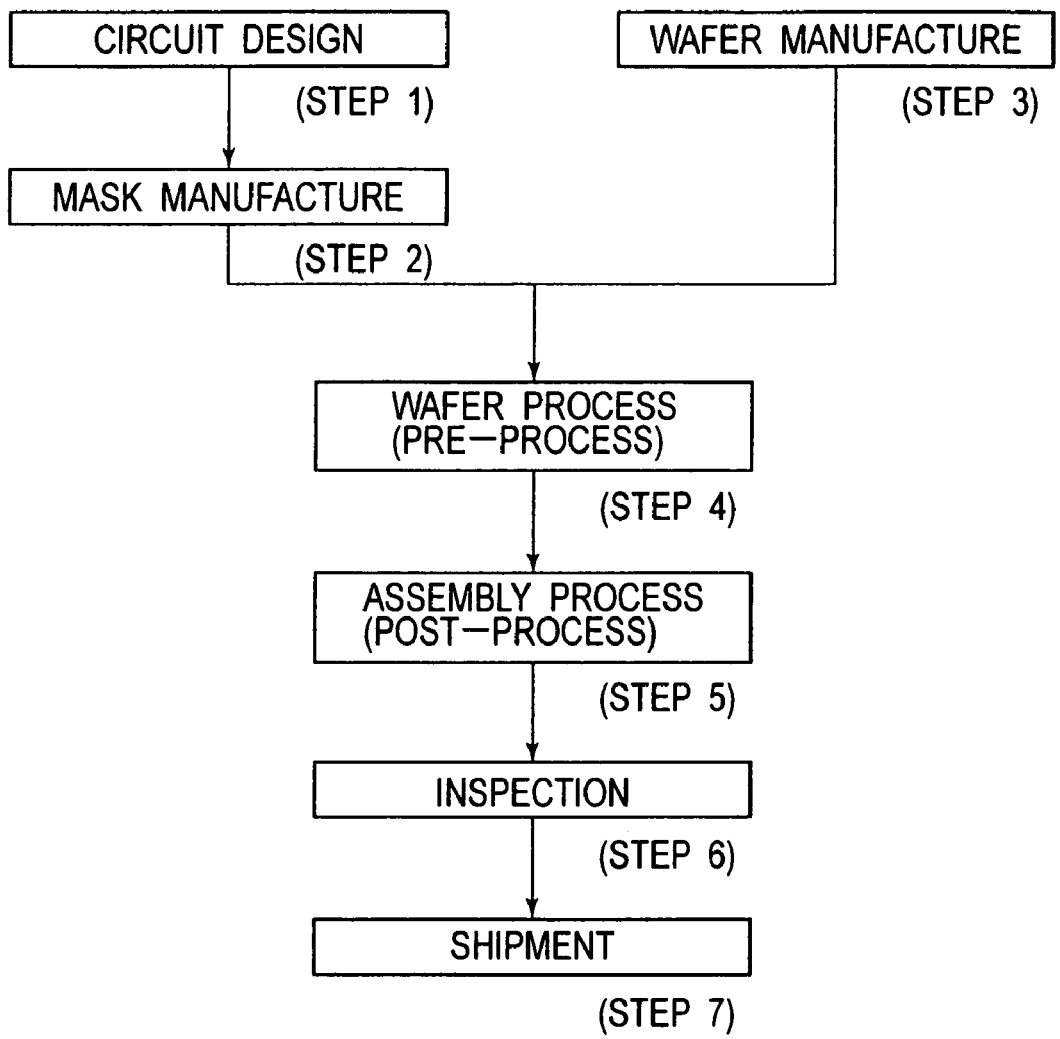
FIG. 15 is a flow chart for explaining a general procedure of semiconductor device manufacturing processes.

FIG. 15 is a flow chart for explaining the overall procedure for semiconductor manufacture. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5, subsequent to this, is an assembling step, which is called a post-process, wherein the wafer having been processed at step 4 is formed into semiconductor chips. This step includes an assembling (dicing and bonding) process and a packaging (chip sealing) process. Step 6 is an inspection step, wherein an operation check, a durability check, and so on, for the semiconductor devices produced by step 5, are carried out. With these processes, semiconductor devices are produced, and they are shipped (step 7).

More specifically, the wafer process at step 4, described above, includes (i) an oxidation process for oxidizing the surface of a wafer, (ii) a CVD process for forming an insulating film on the wafer surface, (iii) an electrode forming process for forming electrodes upon the wafer by vapor deposition, (iv) an ion implanting process for implanting ions to the wafer, (v) a resist process for applying a resist (photosensitive material) to the wafer, (vi) an exposure process for printing, by exposure, the circuit pattern of the mask on the wafer through the exposure apparatus described above, (vii) a developing process for developing the exposed wafer, (viii) an etching process for removing portions other than the developed resist image, and (ix) a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2004-040977, filed Feb. 18, 2004, which is hereby incorporated by reference.

What is claimed is:

1. An exposure apparatus comprising:
a projection optical system configured to project a pattern of an original onto a substrate; and
an original stage, having a first holding portion and a second holding portion, configured to hold the original by use of the first holding portion and the second holding portion, and having a third holding portion configured to hold the original between the first and second holding portions,
wherein the first holding portion has a first holding surface and the second holding portion has a second holding surface, the second holding surface being provided elastically or resiliently displaceable with respect to the first holding surface,
wherein the second holding surface is elastically or resiliently displaceable to contact the original having been placed on said original stage and contacted with the first holding surface, and
wherein the third holding portion has a third holding surface, defined by a plurality of pins, configured to contact to the original.

2. An apparatus according to claim 1, further comprising a suction member configured to attract the original by suction, wherein suction of said suction member is started after the original is contacted with the first holding surface, and then the second holding surface is elastically or resiliently displaced.

3. An apparatus according to claim 1, further comprising a suction member configured to hold, by suction, the original through the first holding surface and to hold, by suction, the original through a groove defined between the first holding surface and the second holding surface.

4. An apparatus according to claim 3, wherein the groove is defined while the second holding surface is elastically or resiliently displaced.

5. An apparatus according to claim 4, wherein the first holding portion and the second holding portion respectively have sealing surfaces which contact each other while the groove is defined, and wherein the sealing surfaces have a tapered structure.

6. An apparatus according to claim 1, wherein the first holding portion is configured to support the second holding portion.

7. An apparatus according to claim 1, further comprising an elastic or resilient member, elastically or resiliently deformable in a direction substantially perpendicular to a pattern surface of the original, and configured to support the second holding portion.

8. An apparatus according to claim 1, wherein the second holding surface is configured to surround the first holding surface.

9. An apparatus according to claim 1, wherein said original stage is configured to scanningly move relative to exposure light.

10. A device manufacturing method comprising:
an exposure step of exposing a substrate to a pattern of an original by use of an exposure apparatus as recited in claim 1; and
a developing step of developing the exposed substrate.

11. An exposure apparatus comprising:
a projection optical system configured to project a pattern of an original onto a substrate; and
an original stage having a first holding portion and a second holding portion, configured to hold the original by use of the first holding portion and the second holding portion, wherein the first holding portion has a first holding surface and the second holding portion has a second holding surface, the second holding surface being provided elastically or resiliently displaceable with respect to the first holding surface, and wherein the second holding surface is elastically or resiliently displaceable to contact the original having been placed on said original stage and contacted with the first holding surface; and
an elastic or resilient member, elastically or resiliently deformable in a direction substantially perpendicular to a pattern surface of the original, and configured to support the second holding portion,
wherein said elastic or resilient member includes one of a leaf spring and a hinge.

12. An exposure apparatus comprising:
a projection optical system configured to project a pattern of an original onto a substrate; and
an original stage having a first holding portion and a second holding portion, configured to hold the original by use of the first holding portion and the second holding portion,
wherein the first holding portion has a first holding surface and the second holding portion has a second holding surface, the second holding surface being provided elastically or resiliently displaceable with respect to the first holding surface,
wherein the second holding surface is elastically or resiliently displaceable to contact the original having been placed on said original stage and contacted with the first holding surface, and
wherein said original stage has four sets of the first holding portion and the second holding portion.

* * * * *